United States Patent [19]

Bogholtz, Jr. et al.

[11] Patent Number: 5,195,097
[45] Date of Patent: Mar. 16, 1993

[54] HIGH SPEED TESTER

[75] Inventors: Richard Bogholtz, Jr., Mahopac; Louis J. Bosch, Hopewell Junction; Thomas H. Mitchell, Jr., Cornwall, all of N.Y.

[73] Assignee: International Business Machines Corporation, Armonk, N.Y.

[21] Appl. No.: 602,433

[22] Filed: Oct. 19, 1990

[51] Int. Cl.⁵ .......................................... G01R 31/28
[52] U.S. Cl. ..................................... 371/27; 371/22.1
[58] Field of Search ............................... 371/27, 22.1; 364/243.41; 395/575

[56] References Cited

U.S. PATENT DOCUMENTS

| | | | |
|---|---|---|---|
| 3,806,888 | 4/1974 | Brickman et al. | 340/172.5 |
| 4,323,968 | 4/1982 | Capozzi | 364/200 |
| 4,389,614 | 6/1983 | Staiger | 328/61 |
| 4,451,918 | 5/1984 | Gillette | 371/27 |
| 4,586,181 | 4/1986 | Shimizu | 371/27 |
| 4,598,245 | 7/1986 | Groves et al. | 324/73 R |
| 4,682,330 | 7/1987 | Millham | 371/20 |
| 4,696,005 | 9/1987 | Millham et al. | 371/27 |
| 4,730,318 | 3/1988 | Bogholtz, Jr. et al. | 371/27 |
| 4,796,222 | 1/1989 | Aichelmann, Jr. | 364/900 |
| 4,931,723 | 6/1990 | Jeffrey et al. | 371/22.3 |
| 4,994,732 | 2/1991 | Jeffrey et al. | 371/27 |

FOREIGN PATENT DOCUMENTS 3613896 4/1986 Fed. Rep. of Germany .

OTHER PUBLICATIONS

J. S. Liptay, "Structural Aspects of the System/360 Model 85 II The Cache" *IBM Systems Journal*, vol. 7, No. 1, 1968, pp. 15-21.

*Primary Examiner*—Charles E. Atkinson
*Attorney, Agent, or Firm*—James R. Warnot, Jr.; H. Daniel Schnurmann

[57] ABSTRACT

A high speed tester stores the data corresponding to the first and last addresses of each test loop in a high speed cache. In the majority of test addresses, data is transferred from a memory into at least two shift registers and the cache is not accessed. The output of the shift registers are interleaved in a multiplexer to provide two bits of test data for each tester clock cycle. Control circuitry decodes bits associated with each data address and controls presenting data to the shift registers from the memory and the cache. Use of the cache allows a continuous output of test data from the multiplexer during repetitions of a loop and when new test loop are introduced, with no intervals in the data, regardless of whether the data terminates on an address boundary.

36 Claims, 8 Drawing Sheets

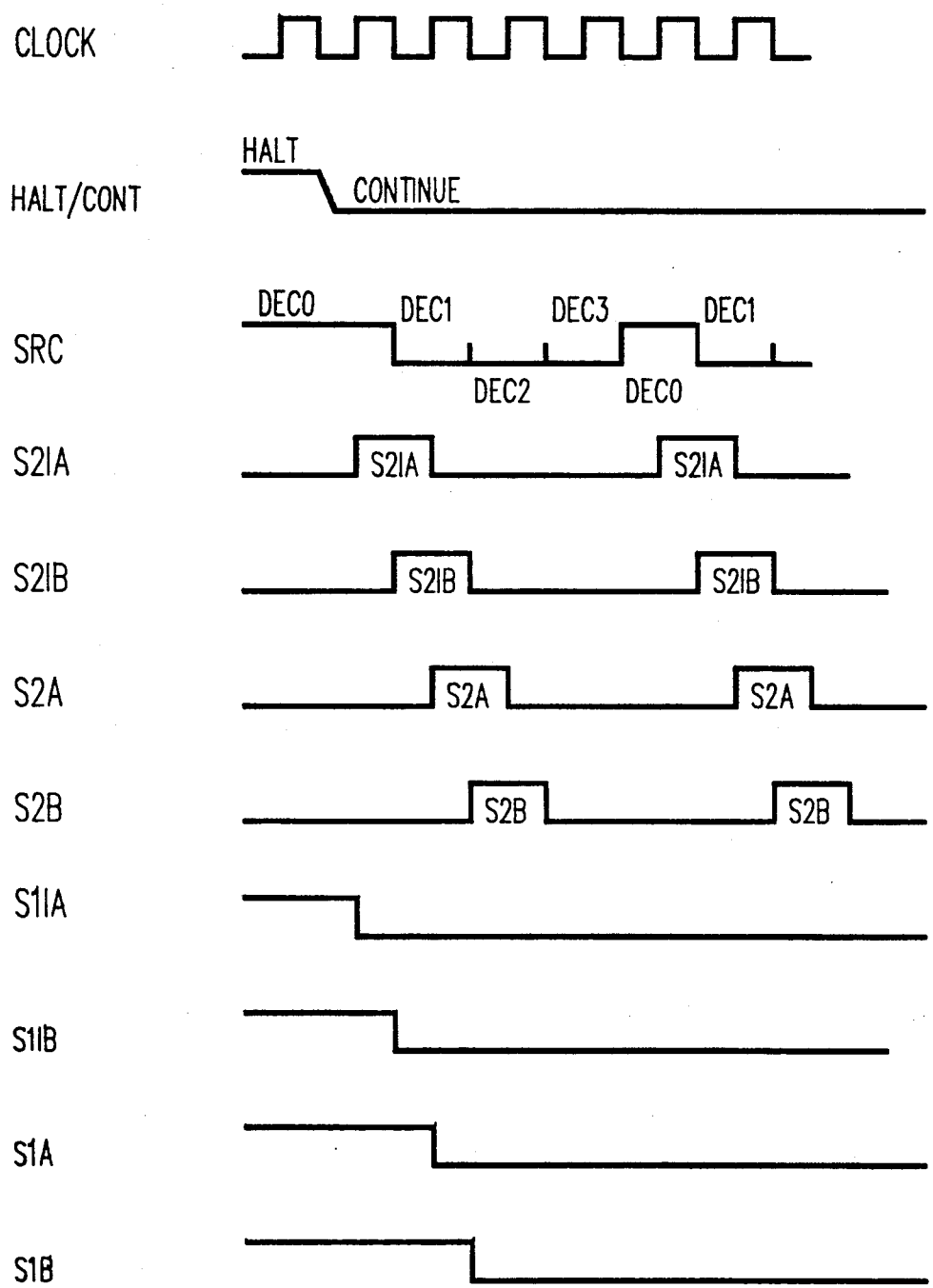
FIG. 4 CLOCK CONTROL

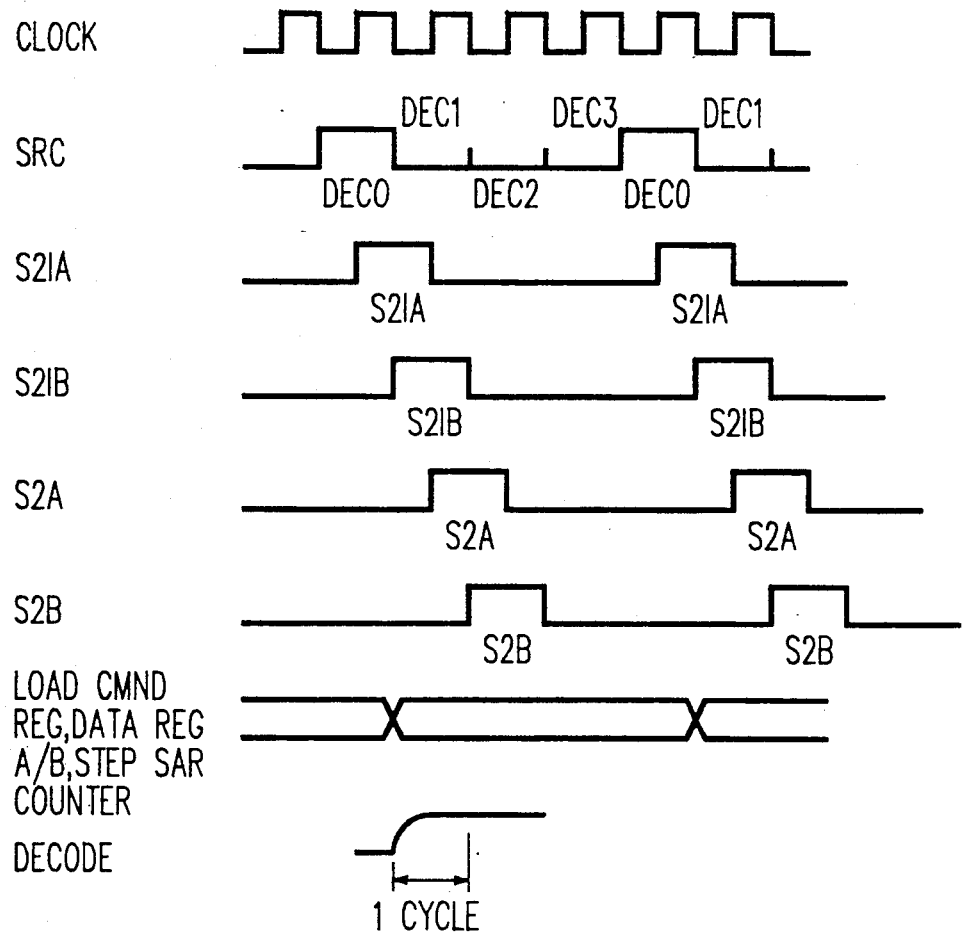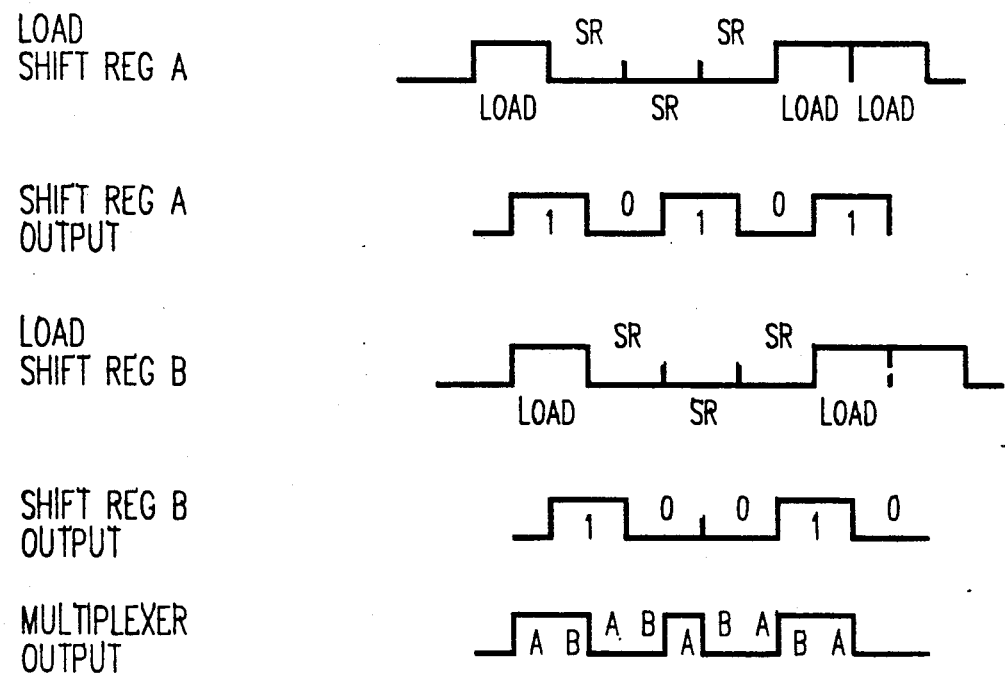
FIG. 5 NOP DECODE

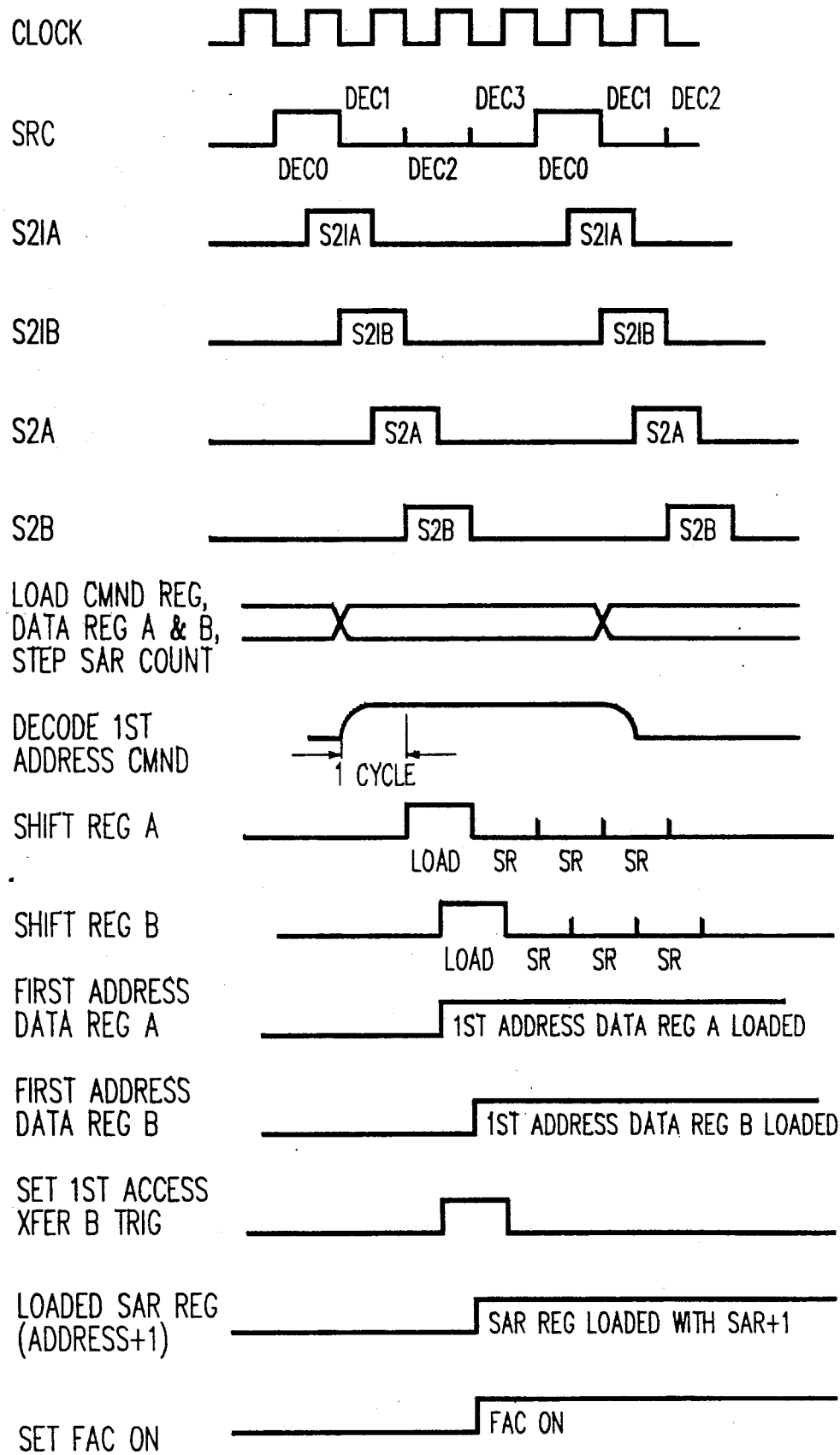
FIG. 6 FIRST ADDRESS DECODE

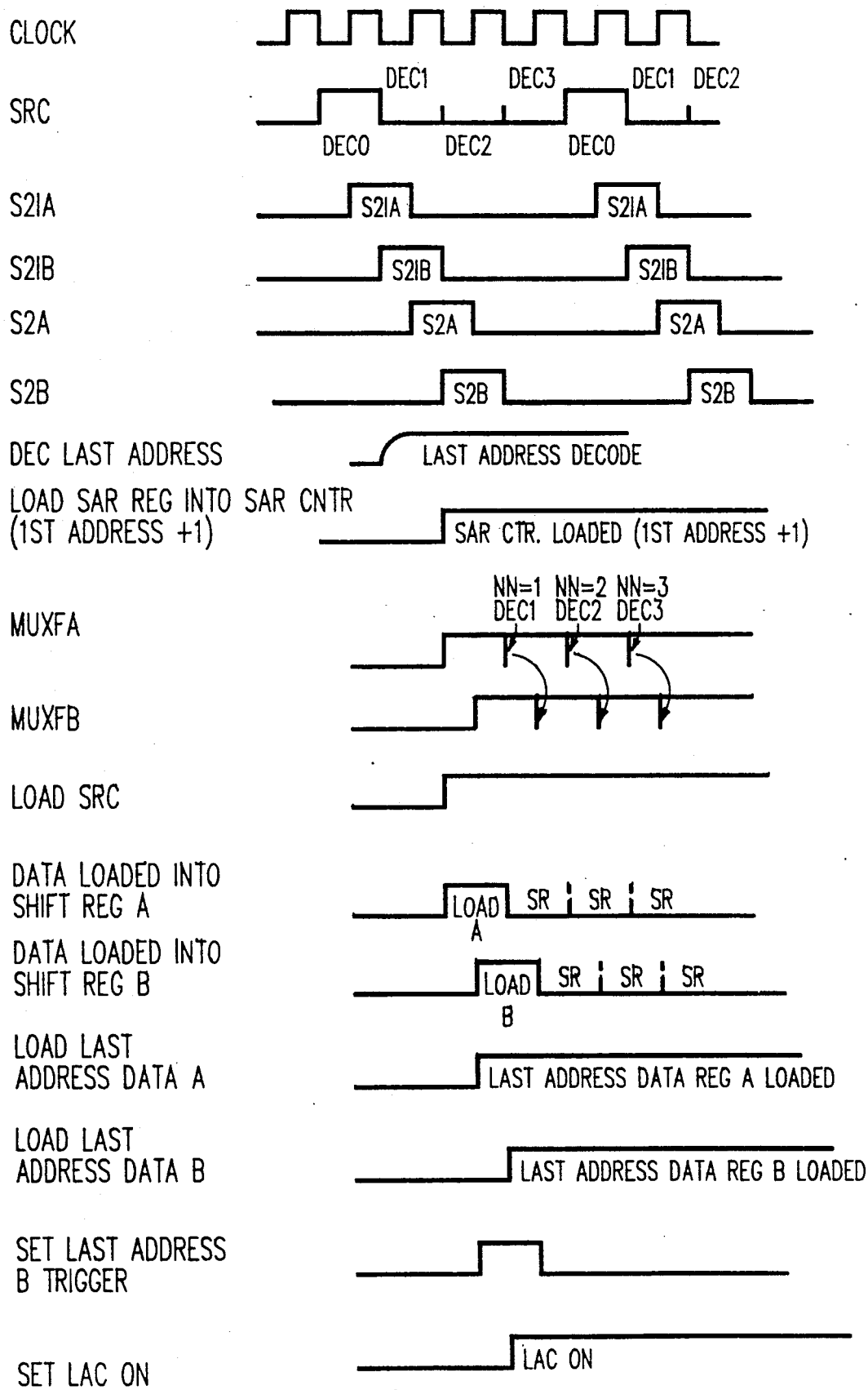
FIG. 7 LAST ADDRESS DECODE

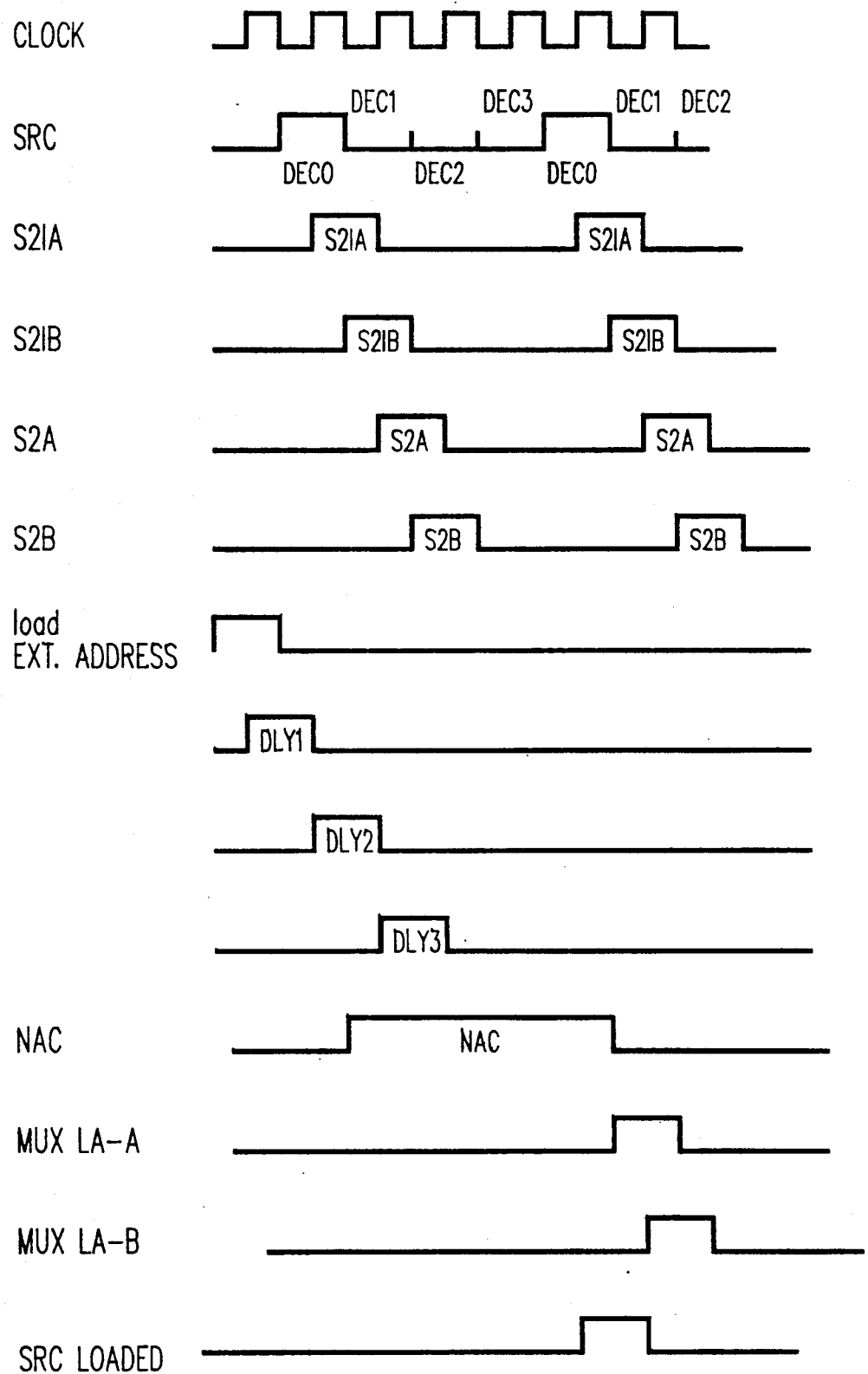
FIG. 8 LOAD EXTERNAL ADDRESS

HIGH SPEED TESTER

TECHNICAL FIELD

This invention relates to high speed VLSI circuit testers. More particularly, in a preferred embodiment, this invention relates to high performance memory testers which introduce loops of data to a device under test at 500 Mhz speed with no intervals between successive loops of data.

BACKGROUND OF THE INVENTION

Current high performance computer system memories include multiple pin VLSI devices and are being architected in increasingly sophisticated manners. To efficiently test these devices, it is necessary to apply large blocks of data to each of the multiple pins of the device Thorough testing of these devices require that each of the circuits be activated and that a plurality of tests be performed at a rate which will permit high volume testing. Since these devices can contain 100,000 or more logic blocks, and since it may be necessary to test each logic block with a variety of test patterns, a test loop for each of the multiple pins of the device may consist of millions of bits of data. Considering the size of these data requirements in conjunction with the fact that it may be necessary to cycle through a loop multiple times for a given pin, it becomes clear that an efficient way of introducing this data to the device under test is necessary. Current testers consist of processing elements which run at a particular clock cycle as well as memory elements in which the data to be introduced to the device under test is stored. Both the size and the speed of this memory are limiting factors in overall tester performance. Some workers in the field have disclosed methods and apparatus to reduce memory requirements, including methods which utilize data compaction techniques.

Millham, U.S. Pat. No. 4,682,330, discloses a test architecture which reduces memory size by using pin address memories and pin control memories. The Millham architecture has a potential to greatly reduce memory capacity requirements, but does not address speed problems. The tester disclosed in Groves et al., U.S. Pat. No. 4,598,245, compresses the amount of data stored in local test data random access memories for the implementation of a circuit test and thereby reduces the required overall memory capacity. Millham et al., U.S. Pat. No. 4,696,005 discloses a data compaction technique in which only those bits of the data in a random access memory which correspond to data which varies from one test loop to the next is changed from one test loop to the next. This compaction technique also reduces the memory capacity requirements.

Other workers in the tester field have disclosed methods and apparatus for increasing the effective speed of the tester memory. Gillette, U.S. Pat. No. 4,451,918 discloses a tester structure in which multiple hierarchies of memories are used. Data is interleaved to the device under test from two high speed memories, which are in turn provided with interleaved data from four lower speed memories. The result of this interleaving is the ability to introduce data to the device under test at a speed of approximately twice that of the higher speed memory. This technique is similar to the use of a cache memory in a hierarchical memory structure in processors, such as those disclosed in Brickman et al., U.S. Pat. No. 3,806,888, Capozzi, U.S. Pat. No. 4,323,968, and J. P. Liptax, "Structural Aspects of the System B60 Model 85: The Cache," IBM Systems Journal, V7/No. 1, 1968, pp. 15-21. Jeffrey, et. al., U S. Pat. No. 4,931,723 also discloses the use of a cache memory in a tester. In each of these implementations, the preferred data path is through the cache, taking advantage of its higher speed. If the required data is not available in the cache, it must be retrieved from the slower memory, thereby requiring more system clock cycles to fetch the required data. It is for this reason that most cache implementations cannot supply a stream of data at constant speed to the processor or the device under test, as the case may be.

Shimizu, U.S. Pat. No. 4,586,181, provides a tester in which all data elements of a test pattern are stored in the identical addresses of a plurality of memories. The desired test pattern is then generated by addressing the plurality of memories in turn without addressing the same memory successively and by then interleaving the outputs of these memories, thereby increasing system speed. This solution to the problem of limited memory speed requires "n" times the normal memory size with "n" being the number of individual memories. Another tester in which the inputs to the device under test are interleaved is disclosed in Staiter, U.S. Pat. No. 4,389,614. Staiter does not disclose a tester which introduces a string of digital test data to the device under test, but rather a tester in which individual pulses introduced to a device under test are within larger pulse intervals. The pulse intervals are then interleaved so that there is no delay between intervals.

Bogholtz et al., U.S. Pat. No. 4,730,318 also discloses a tester in which memory outputs are interleaved to enhance tester speed. Referring to FIG. 1, control processor 20 provides addresses on line 18 to memory A 15 and commands on line 19 to shift register A 17. The control processor 20 also provides addresses and commands to an identical memory B and shift register B, which are not shown. In response to the commands, shift register A 17 loads the data corresponding to a particular address from memory A 15 over line 72. The output of shift register A 17 on line 71 is interleaved with the other shift register output in multiplexer 16. The combined output on line 21 is then introduced to the device under test.

As shown in the timing diagram in FIG. 1, the address normally steps every four clock cycles at the same time as the data is loaded from memory A 15 on line 72 to shift register A 17. The address is normally presented on line 18 to memory A 15 four clock cycles before the data is loaded into shift register A 17. The data is then shifted one bit at a time over line 71 into multiplexer 16. In FIG. 1 and all subsequent figures, the abbreviation "SR" represents the command "Shift Right." In this manner a successive string of bits corresponding to the data required to be presented to the device under test is outputted from multiplexer 16 on line 21. As can be seen from the timing diagram and the above description, Bogholtz et al. describes an implementation using four bit shift registers. The impact on tester performance of memory speed limitations occurs when the loop being run does not terminate on an address boundary. For example, if the last address transfer of the loop required only one bit of the data presented to the shift register at address 2 time, the control processor 20 would then send the starting address of the next loop to memory A 15 and then one clock cycle later would send a load command over line 19 to shift register A 17. In this situation the tester speed is limited by the memory access time. In normal operation within a loop, the memory has four clock cycles to present the data to the shift register.

None of the currently existing tester configurations address this problem. In prior teachings for enhancing memory performance, a fixed access time for the memory closest to the device under test is assumed, regardless of whether the performance enhancement is achieved by decreasing memory capacity requirements or by increasing effective memory speed.

SUMMARY OF THE INVENTION

Current tester configurations show that a need exists for an apparatus which can both continuously output digital data with no interruptions within a test loop and can continue this continuous output with no interruptions between loops of the digital data. Current testers do not meet this need.

It is therefore an object of the present invention to provide a test apparatus which can introduce loops of digital data to a device under test without intervals within or between the loops of data.

It is a further object of the invention to provide a tester using "n" bit shift registers in which the effective access time for the memory which provides data to the shift registers is "n" times the clock cycle time of the tester.

It is yet a further object of the present invention to provide a method of repetitively introducing loops of addressed test data at a predetermined clock rate to a device under test with no intervals within or between the loops of data.

It is still a further object of the present invention to provide an apparatus which can continuously output two bits of digital data for each clock cycle.

In accordance with these and other objects of the present invention, a data processing apparatus is provided which includes a memory for storing and supplying data signals and codes as well as a cache for storing a predetermined set of these signals. The apparatus also contains at least first and second shift registers connected to the memory and to the cache. The shift registers selectively receive the data signals at a predetermined clock cycle rate and shift the stored signals onto first and second output lines in response to first and second clock pulses. The second clock pulses are delayed with respect to the first clock pulses. The apparatus also contains control means for apparatus operational control. The control means control the shift register data signal input from the memory and cache in response to the codes and also control storing the predetermined set of data in the cache. The outputs of the shift register are combined in an output multiplexer (MUX) which is connected to receive the data signals from the first and second output lines of the first and second shift registers, respectively. The multiplexer provides an output having recurrent groups of signals from the first and second registers.

The invention also provides a method of introducing successive loops of data signals at a predetermined clock rate with no intervals between the loops which includes the steps of storing and supplying data signals and codes in a memory, storing a predetermined set of the data signals from the loop being run in a cache, selectively receiving the data signals at the predetermined clock cycle rate in at least first and second shift registers connected to the memory and to the cache, supplying commands in response to the codes and thereby controlling data signal input to the shift registers from memory and the cache, shifting the data signals onto first and second output lines in response to first and second clock pulses, the second clock pulses being delayed with respect to the first clock pulses, and multiplexing the signals on the first and second output lines to provide an output having recurring groups of signals from the first and second shift registers.

The foregoing and other objects, features and advantages of the present invention will be apparent from the following more particular description of a preferred embodiment of the invention as illustrated in the accompanying drawings.

BRIEF DESCRIPTION OF THE DRAWINGS

In the accompanying drawings forming a material part of this disclosure,

FIG. 4 is a timing diagram for the clock control of the apparatus of the present invention.

FIG. 5 is a timing diagram of the apparatus of the present invention for a test address which is neither the first nor last address of a loop.

FIG. 6 is a timing diagram of the apparatus of the present invention for the first address of a loop.

FIG. 7 is a timing diagram of the apparatus of the present invention for the last address of a loop.

FIG. 8 is a timing diagram of the apparatus of the present invention for a load external address command.

DETAILED DESCRIPTION OF THE INVENTION

Figure 1:
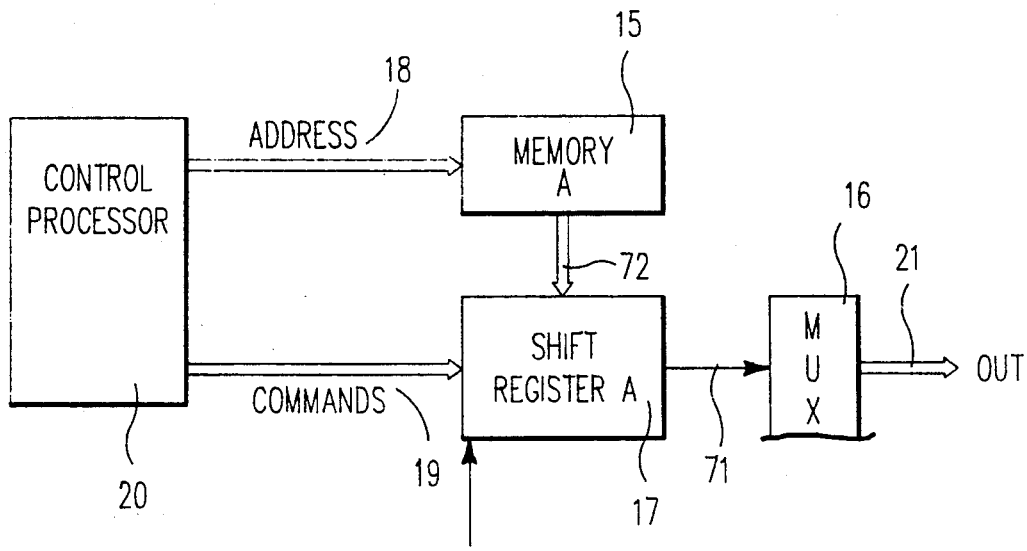
FIG. 1 is a partial block diagram and timing diagram of a prior art tester.
Figure 1:
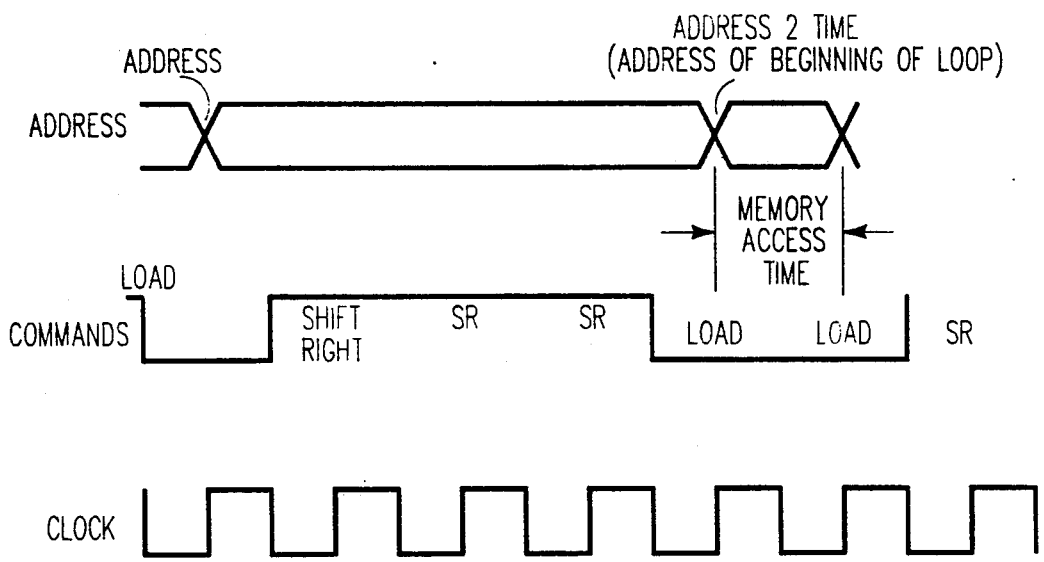
Figure 2:
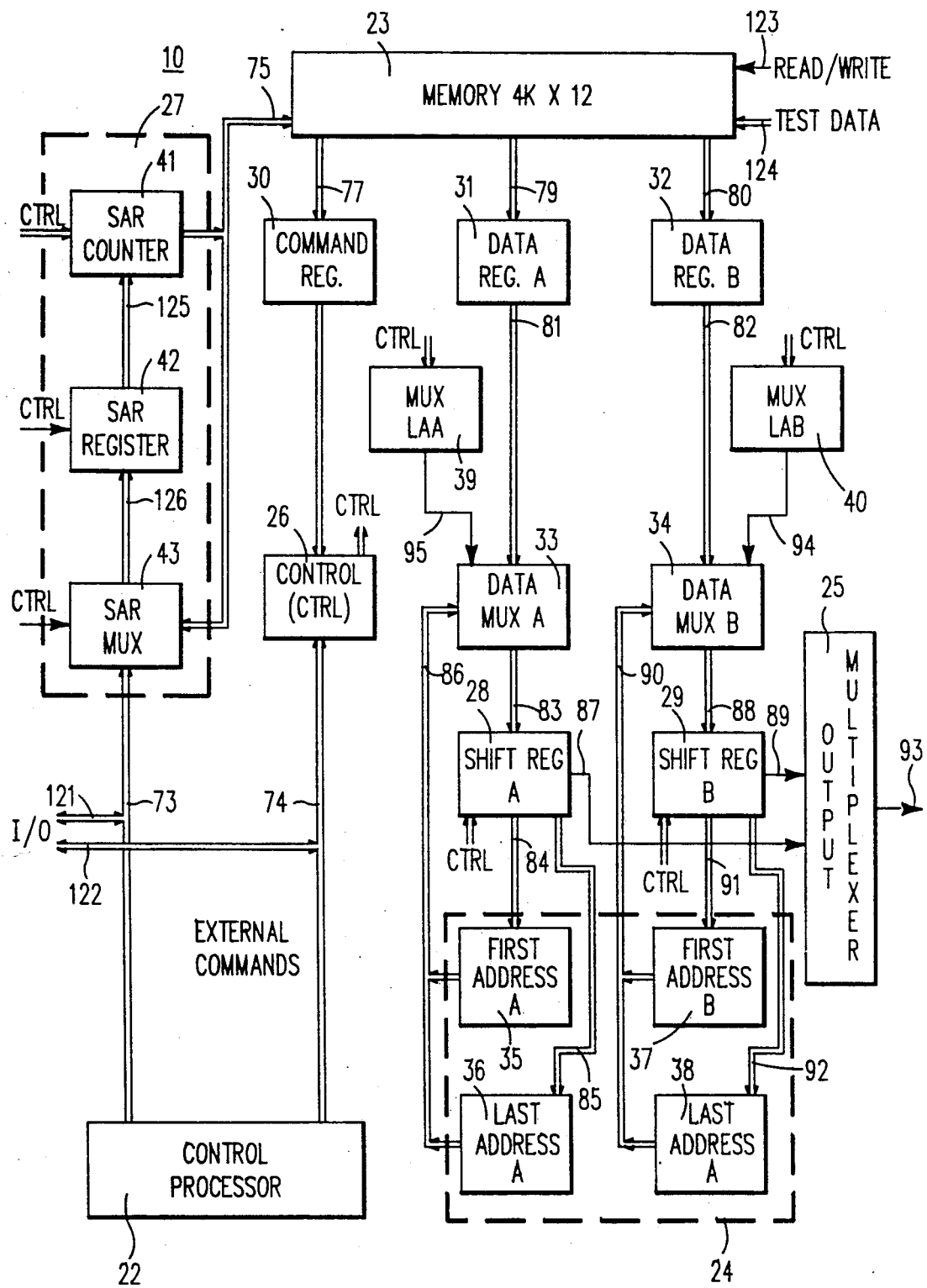
FIG. 2 is a block diagram of the apparatus of the present invention.

Referring to the drawings in more detail and particularly referring to FIG. 2 of the invention there is shown the data processing apparatus 10 according to the present invention. In a preferred embodiment of the present invention, the apparatus 10 comprises one channel of a high speed tester for repetitively introducing loops of addressed data to a device under test. The tester is implemented in a hierarchical pipeline processing architecture, i.e. the overall testing procedure is divided into many parts which are parceled out to separate groups of channels. This overall test apparatus is used for testing a multiple input pin device under test and comprises a multiplicity of the apparatuses shown in FIG. 2, each of these apparatuses providing data signals to a respective input pin of the device under test over output line 93. Data signals are written into memory 23 over line 124 in response to read/write commands over line 123, these signals including codes and test data. The individual channels of a group are maintained in synchronization with each other by control processor 22 which communicates with other groups of channels and with other channels over lines 121 and 122. As will be further described hereinafter, the control processor 22 supplies external commands and addresses to control means 26 and storage address register 27.

The apparatus 10 comprises memory means 23 for addressably storing and supplying test data signals and codes. The test data signals will be applied to the device under test and are digital words comprising addresses, commands and data. In a preferred embodiment of the present invention the test data signals are 8 bits long and the codes are 4 bits long. It should be obvious that this choice is for purposes of illustration only and not for purposes of limitation and that words of any length comprising any combination of codes, data signals and addresses are possible. The description and timing diagrams hereinafter discussed will all refer to this 8 bit test signal non-exclusive implementation of the present invention.

Address cache means 24 for addressably storing a predetermined set of the test data signals are also provided, and in a preferred embodiment the predetermined set of signals corresponds to the first and last addresses of each test loop. The cache means 24 include first address A register 35, last address A register 36, first address register B 37, and last address register B 38.

At least first shift register A 28 and second shift register B 29 are provided, each of the shift registers having "n" positions. As previously described, in the illustrated embodiment n=4. The present invention is not limited to an implementation using two shift registers, this number only illustrating a preferred embodiment. The concept of interleaving the outputs and saving first and last address data in a cache is expandable to larger numbers of shift registers. The shift registers 28, 29 are connected to memory 23 and cache 24 by lines 79, 80, 86, 81, 83, 82, 88, and 90, data register A 31, data register B 32, data mux A 33, and data mux B 34. The shift registers 28, 29 are operative to selectively receive the test data. The shift registers shift the data signals onto first output line 87 and second output line 89 at the predetermined clock cycle rate of the test apparatus in response to first and second clock pulses, the second clock pulses being delayed with respect to the first clock pulses. In the illustrated embodiment, this delay is one-half clock cycle. Data register A 31 and data register B 32 act as temporary storage buffers for test data signals being provided to the shift registers from the memory 23. Data multiplexer A 33 and data multiplexer B 34 provide means for routing the test data signals to the shift register in response to control signals in a manner which will be further explained hereinafter.

An important aspect of the present invention is control means 26, which provide operational control of the test apparatus in response to external commands which are provided over line 74 from control processor 22. Inputs from the control means to other apparatus components are indicated in FIG. 2 by the designation CTRL. The control means are operative to control test data signal input to the shift registers 28, 29 from the memory 23 and cache 24 in response to the codes and control storing the predetermined set of test data signals in the cache 24. In a preferred embodiment this predetermined set is the first and last addresses of each test loop. The codes are input to the control means 26 from memory 23 over line 77, command register 30 and line 78. The test data corresponding to the first and last addresses of each test loop may be routed from cache 24 over lines and 90 through data mux A 33 and data mux B 34 to shift registers A 28 and B 29 over lines 83 and 88 respectively. Data corresponding to other addresses of the test loop is routed from the memory 23 through data register A 31 and data mux A 33 to shift register 28 over lines 79, 81, and 83 and through data register B 32 and data mux B 34 to shift register B 29 over lines 80, 82, and 88. This allows operation of the test apparatus with a memory access time equal to "n," the number of shift register positions, multiplied by the clock cycle rate.

In a preferred embodiment, the control means comprises a means for decoding the codes, input latches responsive to commands from the control processor 22, shift register controller means for controlling the timing of the test apparatus, and a plurality of latches responsive to the outputs of the input latches, clock signals, and the output of the shift register controller, the plurality of latches generating apparatus control timing pulses. The function and operation of the control means will become more clear in the subsequent description of the operation of the test apparatus.

An output multiplexer 25 is connected to receive the test data signals over shift register A output line 87 and shift register B output line 89 and provides an output on line 93 having recurrent groups of signals from the first shift register 28 and the second shift register 29. The function of the control means 26 in controlling signal input to the shift registers 28, 29 allows the test apparatus to continuously output two bits of digital data for each clock cycle.

In a preferred embodiment the test apparatus 10 also comprises a storage address register (SAR) 27 which applies address signals to the memory means over line 75 and saves the first address plus one of a loop. The SAR comprises SAR counter 41, a SAR register 42 for loading the SAR counter 41 over line 125, and SAR mux means 43 for routing address inputs to the SAR register 42 over line 126. Addresses are loaded into the SAR register 42 from the SAR counter 41 over line 76 and from control processor 22 over line 73 through the SAR mux means 43 and line 126.

Having described the components of the test apparatus of the present invention, the detailed operation of the test apparatus will now be described by reference to FIGS. 2 and 3. The basic function of the test apparatus is similar to that of the apparatus disclosed in Bogholtz et al., U.S. Pat. No. 4,730,318. Address signals are applied from the SAR 27 to the memory 23, resulting in the test data signals resident at the requested address being input to shift register A 28 and shift register B 29. The outputs of the shift registers on lines 87 and 89 are then interleaved in output multiplexer 25 and applied to the device under test on line 93.

Figure 3:
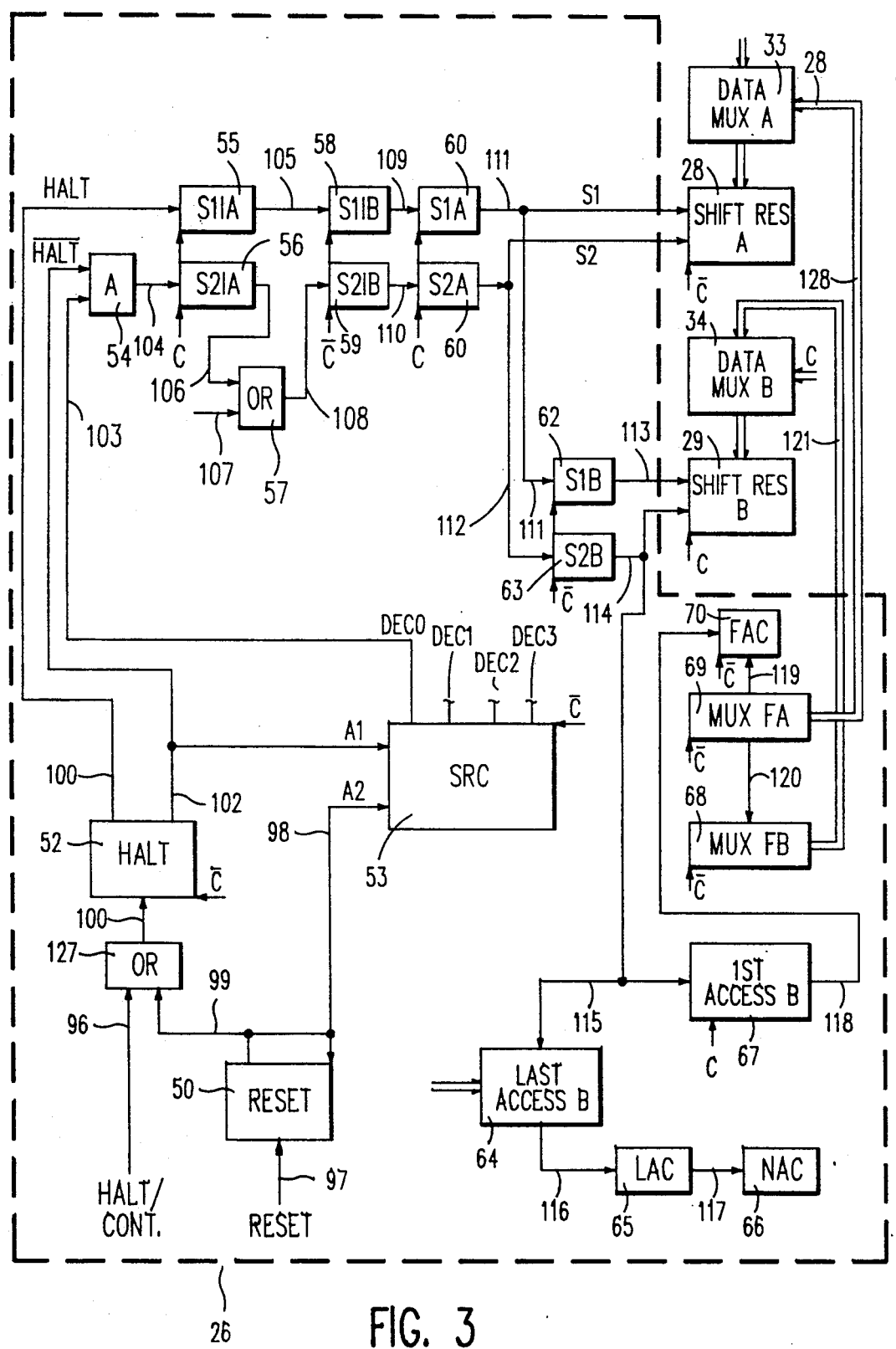
FIG. 3 is a partial block diagram of the control section of the apparatus comprising the present invention.

Referring to FIG. 3, a portion of the circuitry of control means 26 is shown as well as some of the components from FIG. 2, the numerical designators of these components being the same as in FIG. 2. It should be emphasized that other portions of the control means 26 logic are not shown in FIG. 3. FIG. 4 is a diagram of the clock control timing pulses. System operation is initiated and controlled by inputs from the control processor 22 to the control means 26 over line 74 which comprises a plurality of individual lines. The RESET, HALT, and CONTINUE commands are described below with the function of the LOAD EXTERNAL ADDRESS command being explained further hereinafter. In FIG. 3, the symbols "c" and "c̄" correspond to "CLOCK" and "NOT CLOCK," respectively, the former representing the "1" portion of a clock pulse and the latter representing a "0" portion of a clock pulse.

The RESET command, used for system housekeeping, is input over line 97 to the reset input latch 50 and sets tester components to an initial state. The input on line 96 is either a 1, which corresponds to a HALT command, or a 0, which corresponds to a CONTINUE command. This input is combined with the output of reset latch 50 on line 99 in OR gate 127. The output of the OR gate 127 on line 100 is input to reset input latch 52. The output of the reset input latch 50 on line 98 is the A2 input to shift register controller 53 and is equal to 0 when RESET is on. One output of the halt input latch 52 on line 102 is input A1 to shift register controller 53. The value of this signal is 0 when the signal is a HALT, i.e. it is the inverse of the input to latch 52 on line 100. The other output of the halt input latch 52 on line 100 is the input to latch S1IA 55.

As can be seen from FIG. 3, the combination 0,0 of A1-A2 results in a tester apparatus HOLD command. The combination of a positive decode 0 (DEC0) signal on line 103 and an inverse HALT on line 102 results in no output from AND gate 54 on line 104, reflecting the HOLD state of the tester apparatus. The HALT signal on line 100 will propagate through latch S1IA 55 to latch S1IB 58 on line 105 to latch S1A 60 on line 109 and from latch S1IA 60 directly to shift register A 28 on line 111 and to shift register B 29 on lines 111 and 113 via latch S1B 62. As can seen from the Figures, these latches are alternately set by CLOCK and NOT CLOCK signals. Because the DEC0 signal on line 103 is not propagated past AND gate 54 in the HALT case, line S2 112 which carries the direct input to shift register A 28 and an input to shift register B 29 through latch S2B 63 on line 114 is at a 0 level. This combination of S1 equal to 1 and S2 equal to zero results in a HOLD state at shift registers A 28 and B 29.

To begin tester operation, the RESET is turned off so that input A2 to shift register controller 53 on line A2 changes to 1 corresponding to a LOAD command. The shift register controller 53 at this point has a value of 1000 which corresponds to DEC0. The HALT/CONTINUE input on line 96 is then changed to CONTINUE, resulting in the input A1 over line 102 to the shift register controller 53 changing to 1. The combination A1=1, A2=0 corresponds to a shift right command. As can be seen by referring to FIG. 4, at the next NOT CLOCK pulse after the initiation of the CONTINUE command, the DEC0 output of the shift register controller 53 goes to decode 1 (DEC1). Values decode 2 (DEC2) and decode 3 (DEC3) are then shifted out of the shift register controller 53 one clock pulse at a time. After DEC3, the shift register controller 53 wraps around back to DEC0. A DEC0 input on line 103 and a CONTINUE input on line 102 to AND gate 54 results in an output of 1 from AND gate 54 on line 104 for the duration of one clock cycle. As can be seen from FIG. 4, this pulse initiates a series of latches S2IA 56, S2IB 59, S2A 60 and S2B 63, each being serially set for one-half a clock cycle after each other. With the HALT/CONTINUE input 96 being set to CONTINUE the S1IA 55, S1IB 58, S1A 60, and S1B 62 latches are reset serially in the same manner as the S2's. The S1 and S2 outputs of these series of latches results in shift register A operation in the following manner:

| S1A | S2A | |
| --- | --- | --- |
| 1 | 0 | HALT |
| 0 | 0 | SHIFT RIGHT |
| 0 | 1 | LOAD |

Shift register B will respond to S1B, S2B in the same manner one-half clock cycle later.

This basic timing scheme controls the tester apparatus operation under all conditions. Referring again to FIG. 2, the exact operation is determined by the code which is input to control means 26 from memory 23 via line 77, command register 30, and line 78. The following six codes are interpreted by a command decoder within the control means 26:

0000—no operations (NOP)
0001—first address of a loop
01nn—last address of loop with "nn" describing the number of bit pairs taken from the last address
  nn=0 take full byte of data
  nn=01 take one bit pair
  nn=10 take two bit pairs
  nn=11 take three bit pairs.

By reference to FIGS. 2, 3 and 5, operation of the system for a NOP decode, the normal mode during a loop, will be described. The DEC0 signal from the shift register controller 53 over lines 103, 104, and through AND gate 54, in conjunction with a CLOCK signal, produces an S2IA pulse from the S2IA latch 56 over line 106. This pulse initiates the loading of the command register 30 over line 77 from memory 23 and initiates the loading of the data registers 31 and 32 over lines 79 and 80 respectively. The SAR counter 41 of the SAR 27 is also stepped at this time. The S2IA pulse and NOT CLOCK initiates an S2IB pulse from the S2IB latch 59 over line 110, the function of which will become clear hereinafter. The control means 26 is loaded with the command from command register 30 over line 78 and the command is decoded during this clock cycle. The output of the S2IB latch 59 on line 110 and a CLOCK signal initiates a signal from the S2A latch 60 over line 112. This signal on line 112 and a NOT CLOCK pulse in turn initiates the loading of shift register A 28 and initiates an output from S2B latch 63 on line 114. This signal in turn initiates the loading of shift register B 29, in conjunction with a CLOCK pulse. The outputs of the shift registers on lines 87 and 89 are then multiplexed in output multiplexer 25 to form the output on line 93. This cycle will continue, initiated by DEC0 signals, as long as the NOP code is input to control means 26, which will occur for all addresses except the first and last address of a loop.

The shift registers 28, 29 thus shift the stored test data signals onto the first and second output lines in response to first and second clock pulses, the first pulse being a NOT CLOCK portion of a complete clock pulse and the second pulse being a CLOCK portion of a complete pulse. The second pulse is of course delayed one-half clock cycle with respect to the first pulse. The test data signals are thus shifted onto the output lines at the clock cycle rate. As can be seen from FIG. 5, the interleaving of these outputs acts to produce a bit of data on output line 93 every half clock cycle.

If the input to the command register 30 from memory 23 over line 77 corresponds to a first address decode, the above sequence is slightly varied. Referring to FIGS. 2, 3, and 6, the basic timing sequence for the tester is the same as for a NOP decode. At S2IA time, i.e. when an S2IA pulse is generated from the S2IA latch 56 over line 106, and NOT CLOCK, the commands and data are loaded from memory 23 over lines 77, 79 and 78 and the SAR counter 41 is stepped to first address plus 1. There is then one cycle for decoding the command, as with a NOP decode. At S2A time and NOT CLOCK the internal/external trigger of the SAR mux 43 is set to internal, so that input to the SAR register 42 is from the SAR counter 41 over line 76, and the normal loading of shift register A 28 occurs. At S2B time and CLOCK the data in shift register A 28 is loaded into first address A register 35 of cache 24 over line 84, the normal loading of shift register B 29 occurs, and a first access transfer B latch 67 is set, allowing the first access control 70 to be turned on in response to the signal over line 114 at the next NOT CLOCK. With the first access transfer B latch 67 set and a NOT CLOCK signal, the data in shift register B 29 is loaded into first address B register 37 of cache 24 over line 91, the SAR register 42 is loaded with the SAR counter 41 value over line 76 through SAR mux 43 and line 126, this value being first address plus one. The first access control (FAC) trigger 70 is also turned on in response to a signal over line 118. The FAC trigger 70 keeps a history of the occurrence of a first address command. At this point the first address operation is complete. The first address data has been stored in first address A register 35 and first address B register 37, the SAR register has been loaded with first address plus 1 and no interruption in the normal data flow through shift registers A 28 and B 29 has occurred.

Operation of the apparatus will then continue in response to NOP codes, as previously described, until the last address decode occurs. FIG. 7 shows the timing diagram for the last address decode, the basic timing sequence of the tester apparatus being the same as previously described. At S2IA time and NOT CLOCK, commands and data are loaded from memory 23 into registers 30, 31 and 32 over lines 77, 79, and 80 respectively, and the SAR counter 41 is stepped. At S2A time and S2B time the normal loading of shift registers A 28 and B 29 occurs. In a similar manner to the first address decode, one-half cycle after the loading of shift registers A 28 and B 29, the last address A register 36 and the last address B register 38 are loaded over lines 85 and 92, respectively. In response to the signal from the S2B latch 63 over line 115 and CLOCK, the last access B trigger 64 is turned on for one cycle. In response to this signal over line 116 and NOT CLOCK, the last access control (LAC) 65 is turned on. With a decode of last address, and FAC ON, which as previously described occurred with a first address decode, the SAR register 42 address (first address plus 1) is loaded into SAR counter 41 at S2A time and NOT CLOCK. Mux FA 69 is turned on in response to a signal over line 119 and NOT CLOCK, which provides signal to data mux A 33 over line 128 allowing selection of first address data A from first address A register 35 and presentation of this data to shift register A 28 through data mux A 33 over lines 86 and 83. Mux FB 68 is turned on by a signal from mux FA 69 over line 120 and CLOCK which provides a signal to data mux B 34 over line 121 allowing selection of first address B data from first address B register 37 and presentation of this data to shift register B 29 through data mux B 34 over lines 90 and 88. This data cannot be loaded into shift registers A 29 and B 29, of course, until the next S2A and S2B times respectively, these signals being required to initiate loading of the shift registers. While mux FA 69 is turned on the SAR counter 41 is inhibited from stepping. Mux FA 69 is disabled at the next S2A time and NOT CLOCK and mux FB 68 is disabled by a signal from mux FA 69 over line 120, indicating that MUX 69 is turned off, and CLOCK.

Four distinct cases arise with a last address decode, the particular case depending on how many bits of data from the four bit word are required. If nn=0 the full byte of data will be taken and no further actions are required, i.e. operation will continue as if a NOP decode had occurred. If nn=11, three bit pairs of data are required to be input to the shift registers before loading the first address. The shift register controller 53 is loaded with DEC3 which will move up the S2IA pulse occurrence by one clock cycle. If nn=10, two bit pairs of data are required to be input to the shift registers before loading the first address of the cycle. The shifter register controller 53 will be loaded with DEC0 which will move the S2IA pulse up by 2 clock cycles. If nn=01 one bit pair is required from the data of the last address before reloading the first address. The S2IB latch 59 will be set in response to a signal over line 107 through OR gate 57 and line 108 and the shift register controller 53 will be loaded with DEC1. After the first address data is loaded from registers 35, 37, the first address plus one is introduced to the memory 23 from SAR counter 41 over line 72, and operation continues as previously described.

The operation of the system as described allows a continuous flow of data over output line 93 to the device under test. Two bits of data are presented for every clock pulse and no gaps occur between iterations of a loop, even when the data corresponding to the last address of loop is not a complete byte of data. The tester apparatus of the present invention also allows this continuous flow of data when a new test loop is introduced to the apparatus.

When a new loop of test data must be input to the device under test, a load external command is input from the control processor 22 to the control means 26 over line 74. FIG. 7 shows a timing diagram for the load external address case, the basic timing sequence of the tester apparatus being the same as previously described. The load external address command initiates a three-cycle timing chain DLY1, DLY2, and DLY3, each of which is on for one clock cycle. The DLY1 pulse sets the external/internal trigger of the SAR mux 43 to external, so that external addresses are loaded over line 73. DLY2 sets the SAR register 43 with this external address. DLY3 sets the SAR counter 41 with this external address from the SAR register 42 over line 125. If the LAC trigger 65 is on at DLY2 time, the new address control (NAC) trigger 66 is set in response to a signal over line 117. The DLY3 pulse also resets the FAC 70 and LAC 65 triggers. With the NAC trigger 66 on, the next S2IA pulse and NOT CLOCK will set the mux LAA trigger 39. A signal over line 95 activates data mux A 33 to select the last address A data from the last address A register 36 of the cache 24 and present it to the input of shift register A over lines 86 and 83. A half clock cycle later mux LAB trigger 40 is set, which produces a signal over line 94 which activates data mux B 34 to select the last address B data from last address B register 38 of cache 24 and present it to the input of shift register B29 over lines 90 and 88. At S2IA time, NOT CLOCK, and NAC on the stored last address command will determine with what value the shift register controller 53 will be loaded:

| Last Address Decode | SRC LOADED TO |
| --- | --- |
| 0 (full byte) | DEC1 |
| 1 (1 bit pair) | DEC0 |
| 2 (2 bit pairs) | DEC3 |
| 3 (3 bit pairs) | DEC2 |

Mux LAA 39 is turned OFF by the S2A pulse which, in turn, turns off mux LAB 40. Normal operation of the system will then continue, with no intervals between the last address data of the preceding loop and the first address data of the new loop.

Operation of the apparatus according to the present invention allows data transfer to the device under test at approximately 500 Mhz with an overall tester cycle of 250 Mhz, the 2:1 ratio existing because two bits of data are transferred to the device under test during each tester apparatus clock cycle. A comparison with previous testers, in which a maximum cycle speed of approximately 125 Mhz was achievable illustrates the advantage of the apparatus of the present invention.

As can be seen from the preceding description of operation of the test apparatus, the present invention provides a method of repetitively introducing successive loops of addressed test data signals at a predetermined clock rate to a device under test comprising the steps of supplying external commands and addresses from the control processor 22 and supplying data over line 124, the data including test data signals and codes, addressably storing and supplying these addresses and data in memory 23 and storing a predetermined set of these test status signals from a loop in cache 24, in a preferred embodiment this predetermined set being those test data signals corresponding to the first and last addresses of a test loop. In a preferred embodiment this method also comprises saving the first address plus one of the loop in storage address register 27.

The method next comprises the step of selectively receiving these test data signals in at least first shift register 28 and second shift register 29, these shift registers having "n" positions and being connected to the memory 23 and the cache 24. The effective memory access time is equal to "n" multiplied by the clock cycle rate.

The method finally comprises the steps of supplying commands in response to the codes and thereby controlling test data signal input to the shift registers 28, 29 from the memory 23 and cache 24, serially shifting these data signals onto first and second output lines 87, 89 at the predetermined clock cycle rate in response to first and second clock pulses, the second clock pulses being delayed with respect to the first clock pulses, and multiplexing the signals on the first and second output lines 87, 89 to provide an output on line 93 having recurrent groups of signals from the first and second shift registers 28, 29. In the preferred embodiment the first and second clock pulses correspond to not clock pulses and clock pulses of the tester apparatus clock, respectively. This output provides two bits of digital data for each clock cycle.

The step of selectively receiving the test data signals comprises receiving the test data signals corresponding to the first and last addresses from the cache 24 and receiving the test data signals corresponding to other addresses from the memory 23. The step of supplying the commands from the control means 26 includes decoding the codes supplied from the memory 23, latching the external commands in input latches, controlling the process timing with a shift register controller and generating timing pulses with a plurality of latches responsive to the outputs of the input latches, the clock signals, and the shift register controller output.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

What is claimed is:

1. A data processing apparatus comprising: memory means for storing and supplying data signals and codes;
   cache means for storing a predetermined set of the data signals;
   at least first and second shift registers connected to the memory means and the cache means, the shift registers operative to selectively receive the data signals and operative to shift the stored data signals onto first and second output lines at a predetermined clock cycle rate in response to first and second clock pulses, the second clock pulses being delayed with respect to the first clock pulses;
   control means for providing operational control to the apparatus, the control means responsive to the data signals and codes stored in the memory means for controlling shift register data signals input from the memory means and the cache means, and further for controlling the storing of a predetermined set of data signals in the cache means; and
   an output multiplexer connected to receive the data signals on the first and second output lines and operative to provide an output having recurrent groups of signals from the first and second registers.

2. The apparatus of claim 1 wherein the data signals are test data signals comprising addresses, commands, and data.

3. The apparatus of claim 1 further comprising storage address register means for applying address signals to the memory means and for saving the first address plus one of a test loop.

4. The apparatus of claim 3 further comprising control processor means for supplying external commands and addresses to the control means and storage address register means.

5. The apparatus of claim 4 further comprising data multiplexer means for routing data signals to the shift registers in response to control means signals.

6. The apparatus of claim 5 wherein the storage address register (SAR) means comprises:
   a SAR counter;
   SAR register means for loading the SAR counter; and
   SAR mux means for routing address input to the SAR register.

7. The apparatus of claim 6 wherein addresses are loaded into the SAR register from the SAR counter and the control processor through the SAR mux means.

8. The apparatus of claim 7 wherein the predetermined set of data signals correspond to the first and last addresses of a loop of data signals.

9. The apparatus of claim 8 wherein each of the shift registers has "n" positions and wherein the control means control applying the data signals to the shift registers from the memory means and the cache means such that the effective memory access time is equal to "n" multiplied by the clock cycle rate and the apparatus output provides two bits of digital data for each clock cycle.

10. The apparatus of claim 9 wherein the control means comprises:
    means for decoding the codes;

input latches responsive to commands from the control processor;

shift register controller means for controlling apparatus timing; and a plurality of latches responsive to outputs of the input latches, clock signals, and the output of the shift register controller, the plurality of latches operative to generate apparatus control timing pulses.

11. The apparatus of claim 4 wherein the control means comprises:

means for decoding the codes;

input latches responsive to commands from the control processor;

shift register controller means for controlling apparatus timing; and a plurality of latches responsive to the outputs of the input latches, clock signals, and the output of the shift register controller, the plurality of latches operative to generate apparatus control timing pulses.

12. A test apparatus for testing a multiple input pin device under test comprising a multiplicity of apparatuses defined in claim 1, each apparatus being coupled to a respective input pin.

13. A high speed tester comprising:

memory means for addressably storing and supplying test data signals and codes;

cache means for addressably storing a predetermined set of the test data signals;

storage address register means for applying address signals to the memory means and for saving the first address plus one of a test loop;

at least first and second shift registers each having "n" positions connected to the memory means and the cache means, the shift registers operative to selectively receive the test data signals and operative to shift the stored data signals onto first and second output lines at a predetermined clock cycle rate in response to first and second clock pulses, the second clock pulses being delayed with respect to the first clock pulses;

control means for providing operational control to the tester, the control means responsive to the data signals and codes stored in the memory means for controlling shift register test data signals input from the memory means and the cache means, and further for controlling the storing of a predetermined set of test data signals in the cache means, wherein the control means controls applying the test data to the shift registers connected to the memory means and the cache means such that the effective memory access time is equal to "n" multiplied by the clock cycle rate and the tester provides two bits of digital data for each clock cycle; and an output multiplexer connected to receive the test data signals on the first and second output lines and operative to provide an output having recurrent groups of signals from the first and second registers.

14. The tester of claim 13 wherein the test data signals comprise addresses, commands, and data.

15. The tester of claim 13 further comprising data multiplexer means for routing test data signals to the shift registers in response to control means signals.

16. The tester of claim 13 further comprising control processor means for supplying external commands and addresses to the control means and storage address register means.

17. The tester of claim 16 wherein the storage address register (SAR) means comprises:

a SAR counter;

SAR register means for loading the SAR counter; and

SAR mux means for routing address input to the SAR register.

18. The apparatus of claim 17 wherein addresses are loaded into the SAR register from the SAR counter and the control processor through the SAR mux means.

19. The tester of claim 18 wherein the predetermined set of test data signals correspond to the first and last addresses of the loop of test data signals.

20. The tester of claim 19 wherein the control means comprises:

means for decoding the codes;

input latches responsive to signals from the control processor;

shift register controller means for controlling apparatus timing; and a plurality of latches responsive to outputs of the input latches, clock signals, and the output of the shift register controller, the plurality of latches operative to generate tester control timing pulses.

21. The tester of claim 13 wherein the control means comprises:

means for decoding the codes;

input latches responsive to signals to the control processor;

shift register controller means for controlling apparatus timing; and a plurality of latches responsive to outputs of the input latches, clock signals, and the output of the shift register controller, the plurality of latches operative to generate tester control timing pulses.

22. A test apparatus for testing a multiple input pin device under test comprising a multiplicity of apparatuses as defined in claim 13, each apparatus being coupled to a respective input pin.

23. A high speed tester for repetitively introducing loops of addressed data to a device under test comprising:

control processor means for supplying external commands and addresses;

address cache means for storing test data signals corresponding to the first and last addresses of each test loop;

storage address register means for applying address signals to the memory means and for saving the first address plus one of each test loop;

at least first and second shift registers each having "n" positions connected to the memory means and the address caches, the shift registers operative to selectively receive the test data signals and operative to serially shift the stored data signals onto first and second output lines at a predetermined clock cycle rate in response to first and second clock pulses, the second clock pulses being delayed with respect to the first clock pulses;

data multiplexer means for routing test data signals to the shift registers;

control means for controlling tester operation in response to external commands from the control processor, the control means further being responsive to the test data signals and codes stored in the memory means for controlling shift register test data signals input from the memory means and cache means, and still further for controlling storage of the first and last addresses of each test loop in the cache means, wherein the test data corresponding to the first and last addresses is routed from the cache means and the data corresponding to other addresses is routed from the memory means, such that the effective memory access time is equal to "n" multiplied by the clock cycle rate and the apparatus output provides two bits of digital data for each clock cycle; and an output multiplexer connected to receive the test data signals on the first and second output lines and operative to provide an output having recurrent groups of signal from the first and second registers.

24. The tester of claim 23 wherein the storage address register (SAR) means comprises:
a SAR counter;
SAR register means for loading the SAR counter; and
SAR mux means for routing address input to the SAR register.

25. The apparatus of claim 24 wherein addresses are loaded into the SAR register from the SAR counter and the control processor through the SAR mux means.

26. The tester of claim 23 wherein the control means comprises:
means for decoding the codes;
input latches responsive to signals from the control processor;
shift register controller means for controlling apparatus timing; and
a plurality of latches responsive to the outputs of the input latches, clock signals, and the output of the shift register controller, the plurality of latches operative to generate tester control timing pulses.

27. A test apparatus for testing a multiple input pin device under test comprising a multiplicity of apparatuses as defined in claim 23, each apparatus being coupled to a respective input pin.

28. A method of providing successive loops of data signals at a predetermined clock rate comprising the steps of:
storing and supplying data signals and codes in a memory;
storing a predetermined set of the data signals from a loop in a cache;
selectively receiving the data signals in at least first and second shift registers connected to the memory and to the cache;
supplying commands in response to the codes and thereby controlling data signal input to the shift registers from the memory and the cache;
shifting the data signals onto first and second output lines at the predetermined clock cycle rate in response to first and second clock pulses, the second clock pulses being delayed with respect to the first clock pulses; and
multiplexing the signals on the first and second output lines to provide an output having recurrent groups of signals from the first and second shift registers.

29. The method of claim 28 further comprising the steps of applying address signals to the memory from a storage address register and saving the first address plus one of the loop in the storage address register.

30. The method of claim 29 wherein the predetermined set of data signals corresponds to the first and last addresses of the loop.

31. The method of claim 30 further comprising the step of supplying external commands addresses and data.

32. The method of claim 31 wherein the shift registers each have "n" positions and wherein controlling the input of data signals to the shift registers from the memory and the cache yields an effective memory access time equal to "n" multiplied by the clock cycle rate.

33. The method of claim 32 wherein the step of supplying commands comprises:
decoding the codes;
latching the external commands in input latches;
controlling the timing of the process with a shift register controller;
and generating timing pulses with a plurality of latches responsive to outputs of the input latches, the clock signals, and the shift register controller output.

34. A method of repetitively introducing loops of addressed test data at a predetermined clock rate to a device under test comprising the steps of:
supplying external commands, addresses, and data;
addressably storing and supplying addresses, test data signals and codes in a memory;
storing the test data signals corresponding to the first and last addresses of a loop in an address cache;
saving the first address plus one of the loop in a storage address register;
selectively receiving the test data signals in at least first and second shift registers having "n" positions such that the effective memory access time is equal to "n" multiplied by the clock cycle rate, the shift registers connected to the memory and to the cache;
supplying commands in response to the codes and thereby controlling test data signal input to the first and second shift registers from the memory and the cache;
serially shifting the data signals onto first and second output lines at the predetermined clock cycle rate in response to first and second clock pulses, the second clock pulses being delayed with respect to the first clock pulses; and
multiplexing the signals on the first and second output lines to provide an output having recurrent groups of signals from the first and second shift registers.

35. The method of claim 34 wherein the step of supplying commands comprises:
decoding the codes;
latching the external commands in input latches;
controlling the timing of the process with a shift register controller;
and generating timing pulses with a plurality of latches responsive to outputs of the input latches, the clock signals, and the shift register controller output.

36. The method of claim 35 wherein the selectively receiving step comprises receiving the test data signals corresponding to the first and last addresses from the cache and receiving the test data signals corresponding to other addresses from the memory.

* * * * *